United States Patent
Vieux-Rochaz et al.

(10) Patent No.: US 6,815,827 B2
(45) Date of Patent: Nov. 9, 2004

(54) ELECTRICAL CONNECTION BETWEEN TWO FACES OF A SUBSTRATE AND MANUFACTURING PROCESS

(75) Inventors: Line Vieux-Rochaz, Sassenage (FR); Robert Cuchet, Grenoble (FR); Olivier Girard, Saint-Egreve (FR)

(73) Assignees: Commissariat a l'Energie Atomique, Paris (FR); PHS Mems, Paris (FR)

( * ) Notice: Subject to any disclaimer, the term of this patent is extended or adjusted under 35 U.S.C. 154(b) by 0 days.

(21) Appl. No.: 10/204,858

(22) PCT Filed: Feb. 27, 2001

(86) PCT No.: PCT/FR01/00565
§ 371 (c)(1),
(2), (4) Date: Aug. 26, 2002

(87) PCT Pub. No.: WO01/65598
PCT Pub. Date: Sep. 7, 2001

(65) Prior Publication Data
US 2003/0022475 A1 Jan. 30, 2003

(30) Foreign Application Priority Data
Feb. 28, 2000 (FR) .............................. 00 02446

(51) Int. Cl.[7] ........................ H01L 23/48; H01L 21/50
(52) U.S. Cl. ..................... 257/775; 257/777; 438/107; 438/361; 438/612
(58) Field of Search ................. 438/460, 462, 438/67, 106, 107, 109, 424, 455, 459, 361, 427, 430, 612, 613; 257/508, 510, 774, 775, 777

(56) References Cited

U.S. PATENT DOCUMENTS

| | | | | |
|---|---|---|---|---|
| 5,646,067 A | * | 7/1997 | Gaul | 438/612 |
| 5,770,884 A | * | 6/1998 | Pogge et al. | 257/506 |
| 6,383,837 B1 | * | 5/2002 | Tsunashima | 438/107 |
| 6,716,737 B2 | * | 4/2004 | Plas et al. | 438/612 |
| 2004/0043596 A1 | * | 3/2004 | Sasaki et al. | 438/612 |

FOREIGN PATENT DOCUMENTS

| | | | | |
|---|---|---|---|---|
| EP | 0 926 726 | | 6/1999 | |
| EP | 0 974 817 | | 1/2000 | |
| EP | 1 381031 A1 | * | 1/2004 | ............ G11B/5/31 |
| JP | 60 101945 | | 6/1985 | |
| JP | 6-310489 | | 11/1994 | |

\* cited by examiner

Primary Examiner—Wael Fahmy
Assistant Examiner—Anh Duy Mai
(74) Attorney, Agent, or Firm—Oblon, Spivak, McClelland, Maier & Neustadt, P.C.

(57) ABSTRACT

Electrical connection between two faces of a substrate and manufacturing process.

The connection is made by a part (46) of a conducting or semi conducting substrate (20) completely surrounded by at least one electrically insulating trench (32, 36, 44). A contact pad (42) is located on the back face (40) and conducting tracks (38) are located on the front face. The connection is made through the substrate itself.

Application to the manufacture of circuits, components, sensors, etc.

16 Claims, 6 Drawing Sheets

ELECTRICAL CONNECTION BETWEEN TWO FACES OF A SUBSTRATE AND MANUFACTURING PROCESS

DESCRIPTION

1. Technical Field

The purpose of this invention is an electrical connection between two faces of a substrate and a process for making this connection. Its applications include the manufacture of electronic components or circuits or devices necessitating electrical connections like magnetic heads or sensors.

2. State of Prior Art

Document FR-A-2 637 161 describes a process for making electrical connections through a substrate. This process is illustrated in FIGS. 1A, 1B and 1C attached. An insulating layer 12 is deposited on a substrate 10 and the back face of the substrate is scanned at a defined pitch by a laser beam with an appropriate wavelength. The laser radiation is absorbed by the substrate and causes local abrasion of the substrate. When the entire thickness of the substrate has been abraded, radiation reaches the insulating layer 12 which is transparent to the chosen radiation. It remains intact and therefore forms a bottom for holes perforated in the substrate and which are consequently not through holes. Thermal oxidation is then carried out, particularly creating an insulating layer 14 on the wall of holes and on the back face of the substrate (FIG. 1A).

A conducting layer 16 is then deposited that coats the sides and the bottom of the holes. An etching technique is then used to remove part of the insulating layer 12 covering the front face of the conducting layer to create an opening 18 (FIG. 1B).

An electrical contact is then made on the metallic layer 16 through a conducting pad 18 (FIG. 1C). The electrical connection between the front face and the back face of the substrate is then made through the metallic material of the pad 18 and the metallic layer 16. The next step is to use traditional means to make the electrical circuit on the front face of the substrate.

This type of process has at least two disadvantages:

- due to the presence of holes in the substrate, particular precautions have to be taken during some operations related to manufacturing of the circuit, such as spreading of resin, cleaning of parts, etc.;
- the presence of a metallic material in the holes different from the substrate creates stresses and deformations during steps in which temperatures higher than the ambient temperature are necessary; these same stresses and deformations are very harmful during operation of the component at high temperature.

The purpose of this invention is to overcome these disadvantages, by avoiding the presence of holes and reducing differences in nature between different materials.

Document EP-0 926 726 describes a process for making an electronic circuit in which a trench is perforated in a stack formed from a semi conducting substrate, an insulating layer and a dielectric layer. This trench is filled with an oxide. The next step is to drill an opening that is filled with metal. The metallic cylinder makes the connection, as in a normal technique rather than a stack of layers, since the stack of layers comprises two insulating layers.

The abstract for Japanese patent vol. 1995, No. 02, Mar. 31, 1995 (and JP 06 310 489) describes an etching process for a semi conducting substrate. The objective is not to create a permanent connection but to simplify an electrolytic process by enabling the lower face of a substrate immersed in an electrolyte to be raised to an appropriate potential.

The abstract for Japanese patent, vol. 009, No. 251 (E-348), Oct. 8, 1985 (and JP 60 10 1945) describes a process for making a semi conducting component in a substrate and for isolating this component from the rest of the substrate. Therefore, the objective is not to make a connection between one face of the substrate and the other face.

Document EP-A-0 974 817 describes a circuit card for a detector, comprising a cylindrical insulating region formed throughout the thickness of the substrate, the insulation flush with the surface of the substrate.

PRESENTATION OF THE INVENTION

The invention proposes an electrical connection (called "via" conductor) in which the substrate is a conductor (or semiconductor), this conducting property being used to make the connection. It will be observed that in prior art that has been described, if a conducting substrate is used, this conductivity will not always be advantageous since the connection would always be made through an add-on material (layer 16) that is different from the substrate.

According to the invention, the substrate itself will be used as an electrical connection means between the two faces. The part of the substrate that makes this connection must naturally be electrically insulated from the rest of the substrate. This insulation function is done by at least one trench (that can also be called a partition or wall), extending throughout the thickness of the substrate and completely surrounding part of the substrate forming the connection. This (or these) trench(es) must be at least partly filled in to achieve mechanical strength of the entire substrate.

Specifically, the purpose of this invention is a process for making an electrical connection between two faces of a substrate comprising the following operations:

- the starting point is a conducting or semi conducting substrate,
- at least one electrically insulating trench completely surrounding part of the substrate is made throughout the thickness of the substrate, this trench being filled in over at least part of its depth,
- a first conducting means is deposited on one of the faces of the substrate, this means being in electrical contact with the substrate over the part completely surrounded by the trench, this process being characterized in that:

- a first groove is formed starting from a first face of the substrate, and this first groove is filled in by at least one insulating material,
- the substrate is thinned until it has the required thickness,
- a second conducting means is formed on the thinning face of the thinned substrate facing the part of the substrate that is completely surrounded by the groove,
- a second groove is formed starting from the thinning face of the thinned substrate, facing the first groove and opening up onto the material filling the first groove, said electrical connection thus being set up by said part of the substrate completely surrounded by the trench and by the first and second conducting means.

Another purpose of this invention is an electrical connection obtained by the process defined above. This connection comprises:

- at least one electrically insulating trench extending throughout the thickness of the substrate and completely surrounding part of the substrate, this trench being filled in over at least part of its depth, a first conducting means on one of the faces of the substrate, this means being in electrical contact with the substrate in the part completely surrounded by the trench, a second conducting means on the other face of the substrate, in electrical contact with the substrate in said part completely surrounded by the trench, said connection thus being set up by said part of the substrate completely surrounded by the trench and by the first and second conducting means, this electrical connection being characterized in that:

the filled in part of the trench comprises a first groove formed in the substrate starting from a first face of the substrate, an electrically insulating material filling in this first groove and a second groove formed in the substrate, starting from a second face of the substrate, this second groove having a bottom opening up into the filled in part of the trench.

The trench may be formed from two grooves facing each other and each formed from the opposite sides of the substrate. One of the grooves, or possibly both, are filled in.

According to one embodiment, the filled in part of the trench comprises a first groove etched in the substrate starting from a first face of the substrate, an electrically insulating material filling in this first groove.

According to another embodiment, the wall of the first groove is covered by an insulating layer and the groove is filled in by another material. This other material may be electrically conducting or semi-conducting; preferably, the coefficient of expansion of this material is similar to the coefficient of expansion of the substrate.

This trench can be made by etching two communicating grooves starting from the two faces of the substrate and filling in at least one of them or making a single groove and thinning the other face of the substrate as far as the said groove.

It is also possible to make several concentric or non-concentric trenches, for example two, one on the inside and one on the outside.

In the above definitions, the "first" and "second" faces may be the "front" and "back" faces of the substrate or the "back" and "front" faces, since these names are conventional and have no limitative nature.

BRIEF DESCRIPTION OF THE DRAWINGS

FIG. 6 illustrates the groove thus covered being filled in;

FIG. 10 illustrates the formation of a second groove in the thinned substrate, and shows the completed electrical connection in an embodiment in which the second groove is not filled in;

DESCRIPTION OF PARTICULAR EMBODIMENTS

Figure 1A:
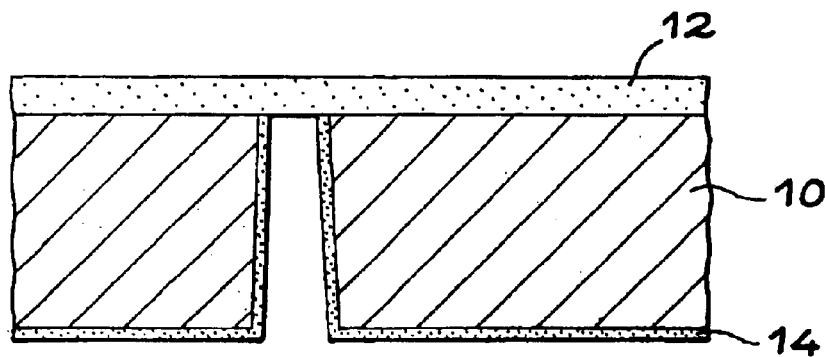
FIGS. 1A, 1B and 1C described above illustrate a process for making a connection according to prior art.
Figure 1B:
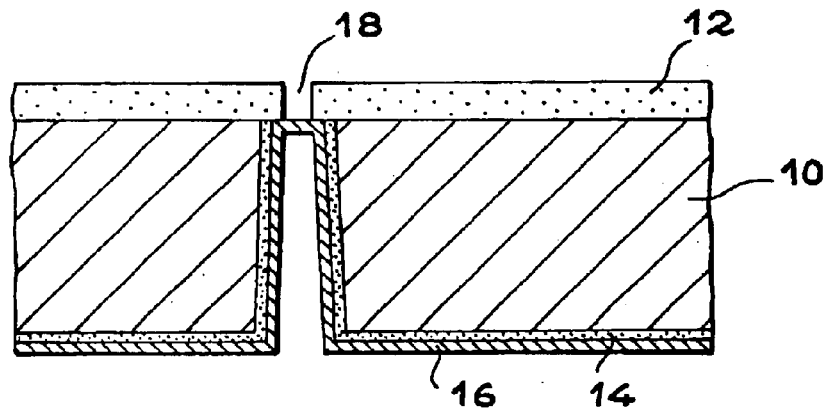
Figure 1C:
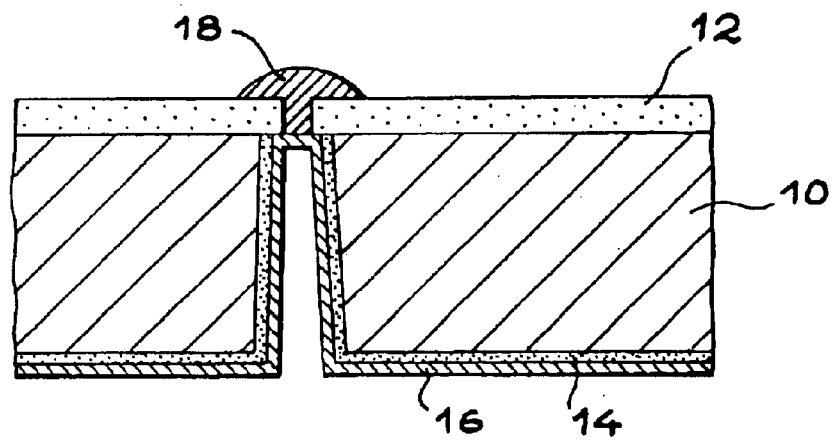
Figure 2A:
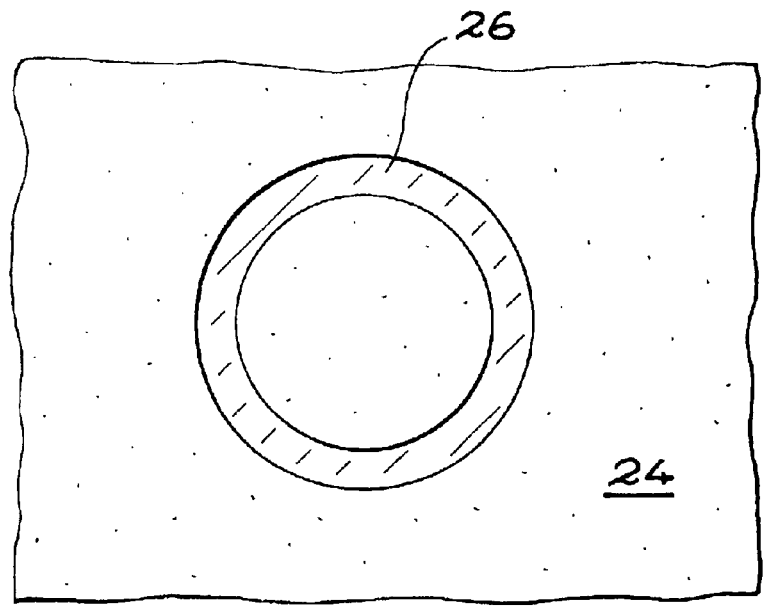
FIGS. 2A and 2B illustrate a top view and a sectional view of a first step in a process according to the invention.
Figure 2B:
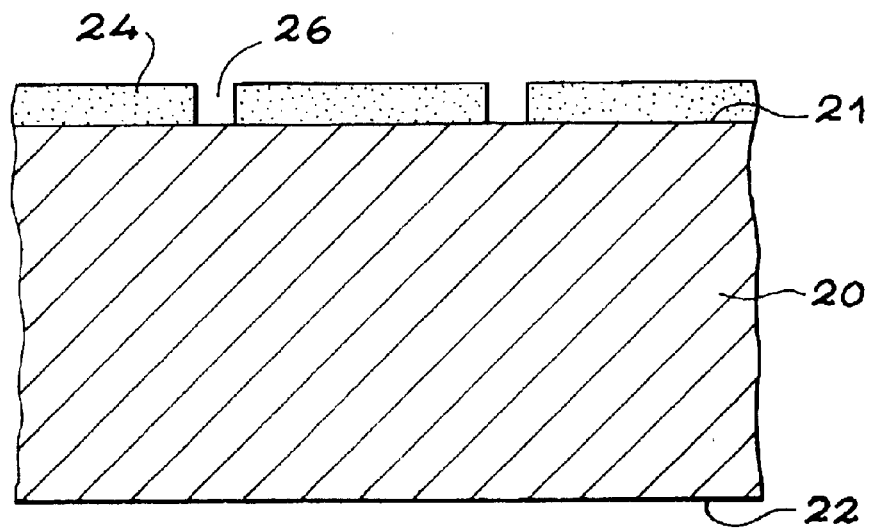

FIGS. 2A and 2B show a substrate 20, for example in the form of a 500 μm thick silicon slice with a resistivity of 2 mΩxcm. This substrate has a first face 21 that will be denoted the "front" face and a second face 22 that will be denoted the "back" face. The front face 21 is covered with a photosensitive resin 24 that is insolated through a mask to define a closed pattern that will correspond to the future trench. In the embodiment shown, this closed pattern is a circular ring 26, for which the inside diameter may for example be 180 μm and the width may be 6 μm. When the resin is developed, the front face 21 of the substrate is exposed along the ring 26.

Figure 3:
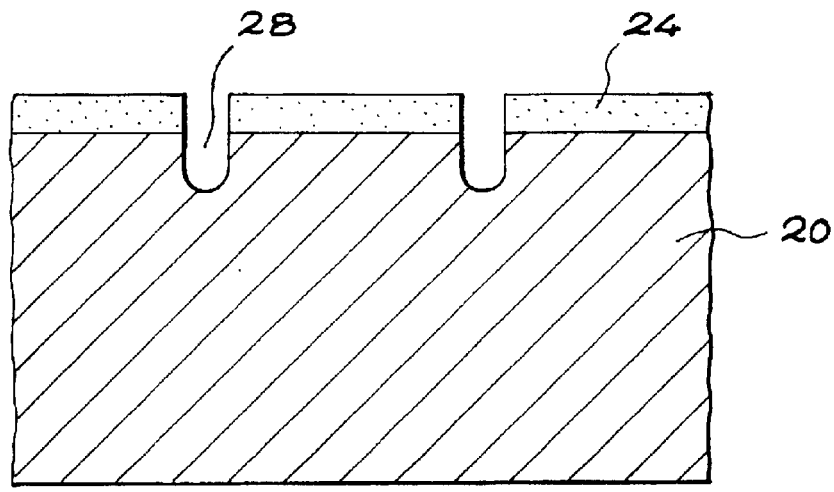
FIG. 3 illustrates formation of a first groove.

The substrate is etched, for example by dry etching, in the exposed area to obtain a groove 28 as illustrated in FIG. 3. For example, the depth of this groove may be 60 μm.

Figure 4:
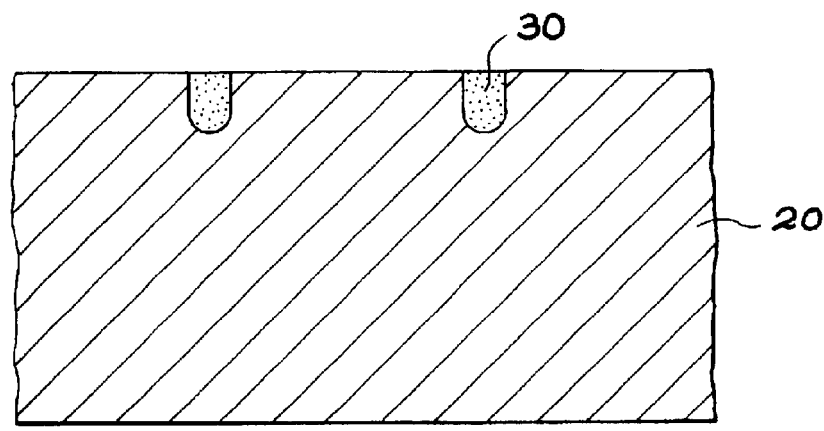
FIG. 4 illustrates a variant in which this first groove is filled in by an insulating material.

After removal of the resin, this groove may be filled in with an insulating material reference 30, in a first variant illustrated in FIG. 4.

Figure 5:
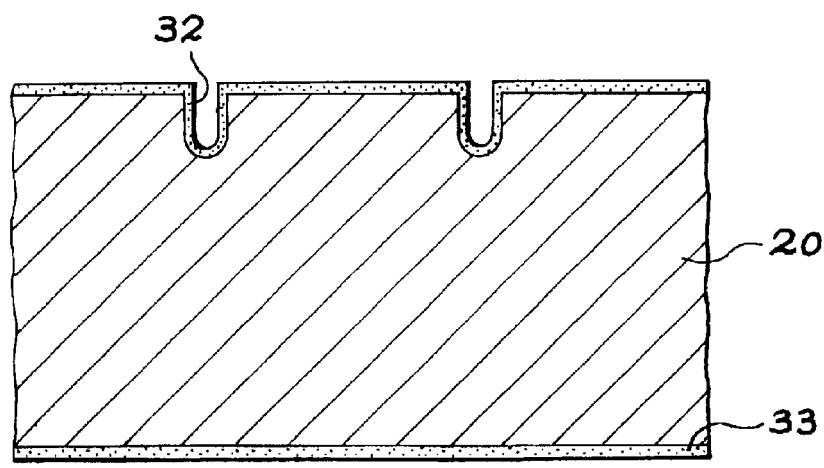
FIG. 5 illustrates another variant in which the wall of the first groove is covered with an insulating layer.
Figure 6:
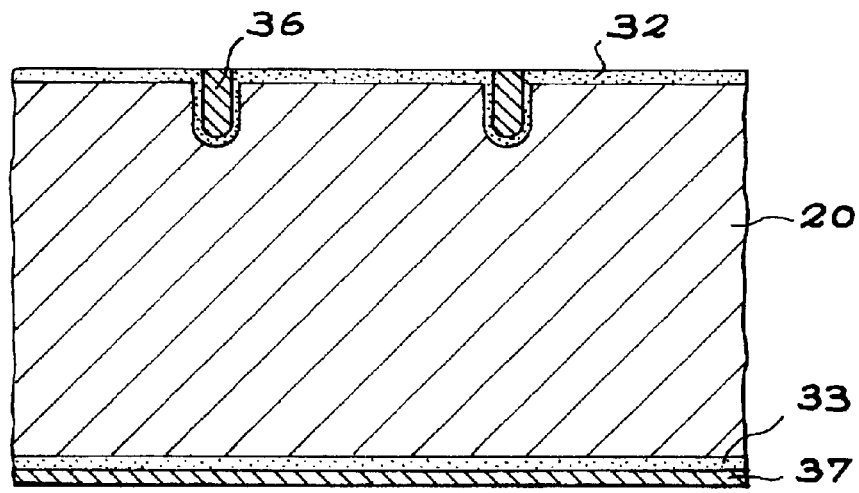

In another variant illustrated in FIG. 5, the entire substrate is oxidized by heat such that a thin insulating layer 32 (in fact a layer of silica if the substrate is made of silicon) covers the inside wall of the groove. An insulating layer 33 is also deposited on the back face. The next step is to deposit a material preferably with a coefficient of thermal expansion similar to that of the substrate, for example using chemical vapor deposition (CVD). For example, it could be polycrystalline silicon if the substrate is made of silicon. This material is denoted reference 36 in FIG. 6. A layer 37 may also be deposited on the back face. The next step is to polish the front face, for example using a mechanical-chemical process to leave material 36 only in the grooves.

Figure 7:
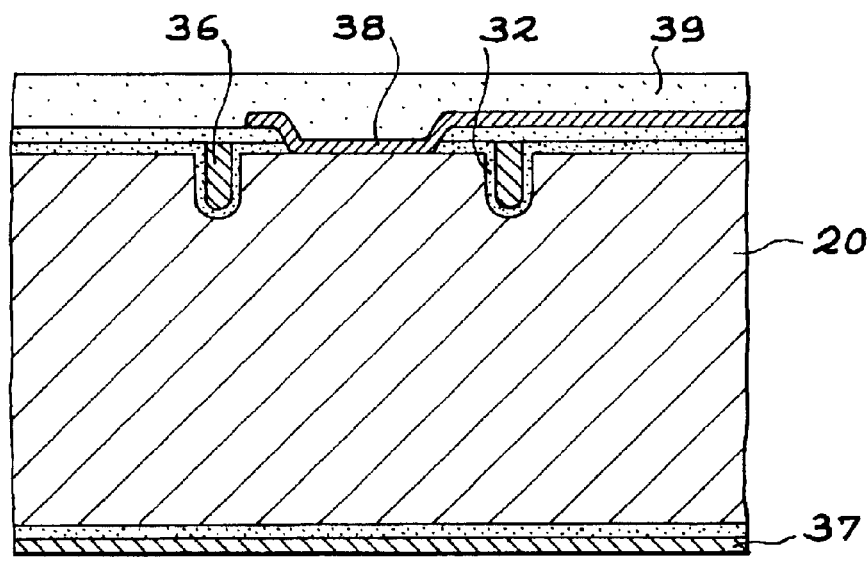
FIG. 7 illustrates an additional step in the formation of layers to form circuits or interconnections on the front face of the substrate.

FIG. 7 illustrates a next step in which a first conducting means 38 is made which, in the variant illustrated, is in the form of various conducting tracks on the front face of the substrate. This may be obtained by known processes in micro-electronics. These tracks are in electrical contact with the substrate in the area located inside the first groove. A protective layer 39 may cover the complete assembly.

Figure 8:
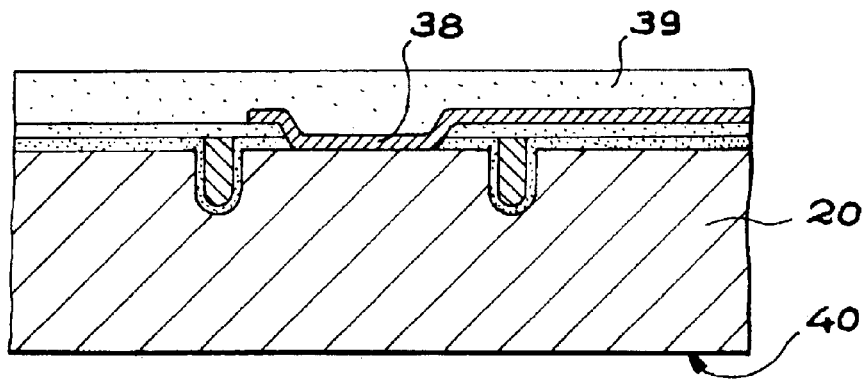
FIG. 8 illustrates an operation to thin the substrate through the back face.
Figure 9:
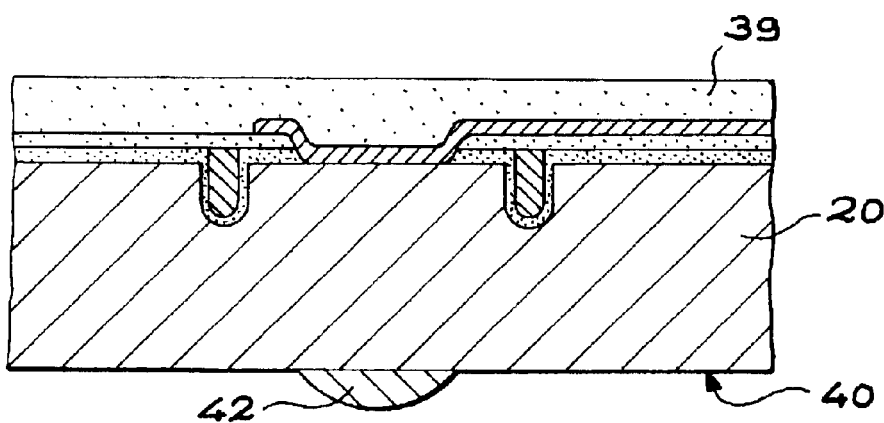
FIG. 9 illustrates the formation of a contact pad on the back face of the substrate.

The substrate can then be thinned as shown in FIG. 8, for example by a mechanical, mechanical-chemical or chemical process until the required thickness, for example 250 μm, is obtained. The new back face is denoted reference 40. FIG. 9 shows a second conducting means 42, for example a contact pad made for example of metal, on this back face. Metallic wires could be soldered onto this pad, or weld beads could be deposited (depending on the application). The location of the second conducting means 42 corresponds to the inside of the ring defined by the first groove made on the front face.

Figure 10:
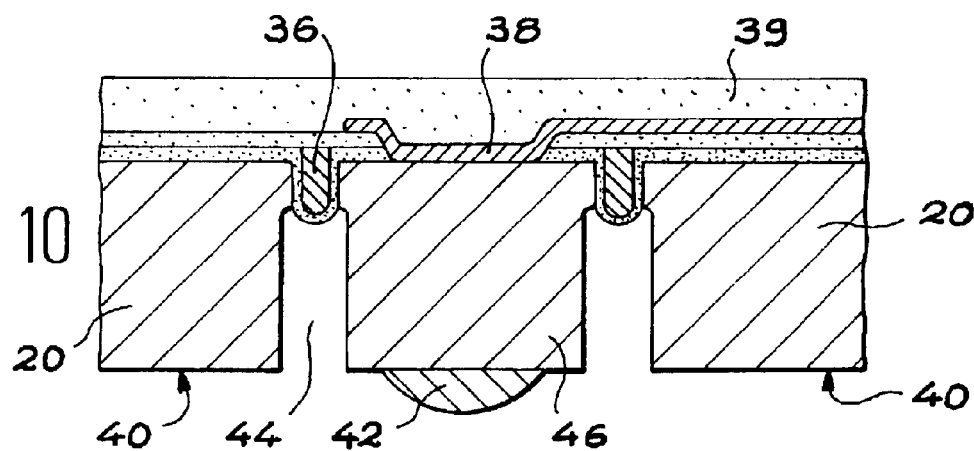

As illustrated in FIG. 10, the next step is to form a second groove 44 starting from the back face 40, using the same photolithography and etching processes as for the first groove. Etching is continued until it reaches the infill material in the first groove. The part 46 of the substrate is thus completely isolated. This part 46 forms an electrical connection electrically connecting the first conducting means 38 made on the front face and the second conducting means 42 on the back face.

In the example taken, with the dimensions given and using a silicon substrate, a connection is obtained with a resistance of the order of 1 Ohm. Obviously, this is simply an example and in no way limits the invention. Another value can be obtained by modifying the thickness of the substrate and/or the inside diameter of the ring, and/or the resistivity of the substrate.

Figure 11:
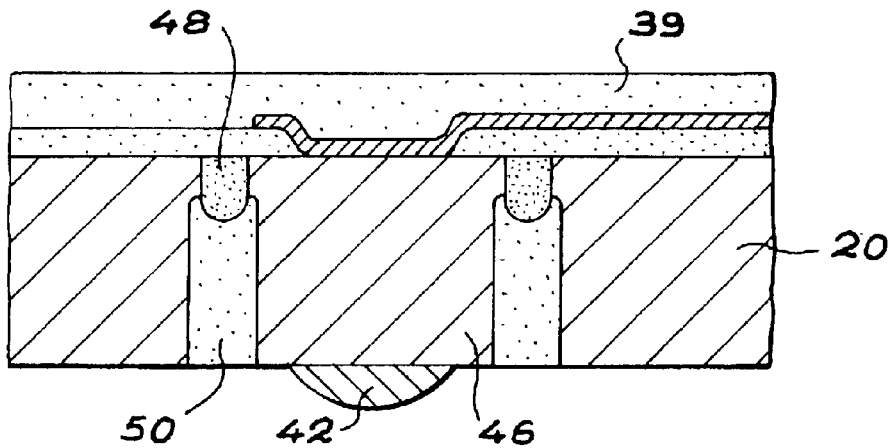
FIG. 11 illustrates another variant in which the two grooves are filled in by insulating materials.

FIG. 11 illustrates another embodiment in which the first groove formed on the front face is filled in by an insulating material 48 (for example glass, silica, etc.), the second groove formed on the back face can also be filled in by an insulating material 50 (glass, silica, etc.).

According to another embodiment, the trench only comprises one filled in groove, the substrate then being thinned until the groove infill material is exposed.

Figure 12:
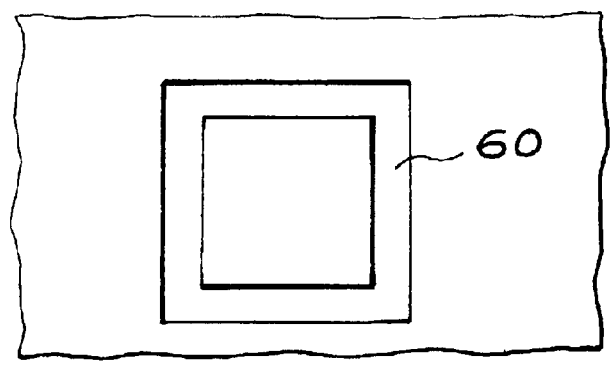
FIGS. 12A, 12B, 12C show various trench patterns and illustrate a variant with two triangular grooves.
Figure 12:
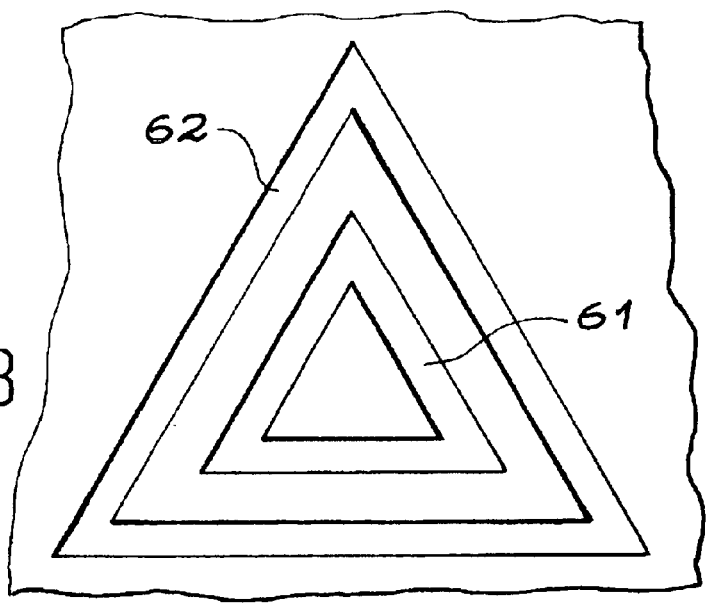
Figure 12:
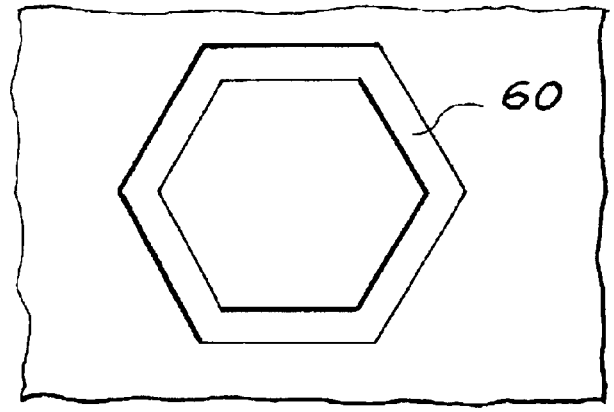

The last step shown in FIGS. 12A, 12B and 12C is three closed profiles 60 that are not circular, namely square, triangular and hexagonal profiles respectively. All of these shapes are simply given as examples. FIG. 12B shows the case in which two trenches 61 and 62 are made. It would be possible to make more, regardless of the shape of the profile.

Furthermore, the trenches are not necessarily made with two vertical side walls, but they could be made with other profiles, for example inclinable.

What is claimed is:

1. Process for making an electrical connection between two faces of a substrate comprising the following operations:

the starting point is a conducting or semi conducting substrate, at least one electrically insulating trench completely surrounding part of the substrate is made throughout the thickness of the substrate, this trench being filled in over at least part of its depth, a first conducting means is deposited on one of the faces of the substrate, this means being in electrical contact with the substrate over the part completely surrounded by the trench, this process comprising:

a first groove is formed starting from a first face of the substrate, and this first groove is filled in by at least one insulating material, the substrate is thinned until it has a desired thickness, a second conducting means is formed on the thinning face of the thinned substrate facing the part of the substrate that is completely surrounded by the groove, a second groove is formed starting from the thinning face of the thinned substrate, facing the first groove and opening up onto the material filling the first groove, said electrical connection thus being set up by said part of the substrate completely surrounded by the trench and by the first and second conducting means.

2. Process according to claim 1, in which a layer of electrically insulating material is deposited on the walls of the first groove and this groove is filled in by another material.

3. Process according to claim 1, in which the second groove is filled in.

4. Process for making an electrical connection between two faces of a substrate comprising the following operations:

the starting point is a conducting or semi conducting substrate, at least one electrically insulating trench completely surrounding part of the substrate is made throughout the thickness of the substrate, this trench being filled in over at least part of its depth, a first conductor is deposited on one of the faces of the substrate, this first conductor being in electrical contact with the substrate over the part completely surrounded by the trench, the process comprising:

forming a first groove, starting from a first face of the substrate, and filling in the first groove by at least one insulating material, thinning the substrate to a desired thickness, forming a second conductor on the thinning face of the thinned substrate facing the part of the substrate that is completely surrounded by the groove, forming a second groove, starting from the thinning face of the thinned substrate, facing the first groove and opening up onto the material filling the first groove, said electrical connection thus being set up by said part of the substrate completely surrounded by the trench and by the first and second conductors.

5. Process according to claim 4, in which a layer of electrically insulating material is deposited on the walls of the first groove and the first groove is filled in by another material.

6. Process according to claim 4, in which the second groove is filled in.

7. Electrical connection between the two faces of a conducting or semi-conducting substrate, comprising:

at least one electrically insulating trench extending throughout the thickness of the substrate and completely surrounding part of the substrate, this trench being filled in over at least part of its depth, a first conducting means on one of the faces of the substrate, this means being in electrical contact with the substrate in the part completely surrounded by the trench, a second conducting means on the other face of the substrate, in electrical contact with the substrate in said part completely surrounded by the trench, said connection thus being set up by the part of the substrate completely surrounded by the trench and by the first and second conducting means, wherein the filled in part of the trench comprises a first groove formed in the substrate starting from a first face of the substrate, an electrically insulating material filling in this first groove, and a second groove formed in the substrate starting from a second face of the substrate, this second groove having a bottom opening up into the filled in part of the trench.

8. Electrical connection according to claim 7, in which an electrically insulating layer covers the wall of the first groove, and another material fills in this first groove.

9. Electrical connection according to claim 8, in which the material filling in the first groove has a coefficient of expansion similar to the coefficient of expansion of the substrate.

10. Electrical connection according to claim 7, in which the second groove is also filled in.

11. Electrical connection according to claim 8, in which the first conducting means is formed from a conducting track and the second conducting means is an electrical contact pad.

12. Electrical connection between the two faces of a conducting or semi-conducting substrate, comprising:

at least one electrically insulating trench extending throughout the thickness of the substrate and completely surrounding part of the substrate, the trench being filled in over at least part of its depth, a first conductor on a first face of the substrate, in electrical contact with the substrate in the part completely surrounded by the trench, a second conductor on the other face of the substrate, in electrical contact with the substrate in said part completely surrounded by the trench, said connection thus being set up by the part of the substrate completely surrounded by the trench and by the first and second conductors, wherein the filled in part of the trench comprises a first groove formed in the substrate starting from a first face of the substrate, an electrically insulating material filling in the first groove, and a second groove formed in the substrate starting from a second face of the substrate, the second groove having a bottom opening up into the filled in part of the trench.

13. Electrical connection according to claim 12, in which an electrically insulating layer covers the wall of the first groove, and another material fills in the first groove.

14. Electrical connection according to claim 13, in which the material filling in the first groove has a coefficient of expansion similar to a coefficient of expansion of the substrate.

15. Electrical connection according to claim 12, in which the second groove is also filled in.

16. Electrical connection according to claim 13, in which the first conductor is formed from a conducting track and the second conductor includes an electrical contact pad.

* * * * *